United States Patent

Yamamoto et al.

[11] Patent Number: 5,156,771

[45] Date of Patent: * Oct. 20, 1992

[54] ELECTRICALLY CONDUCTIVE PASTE COMPOSITION

[75] Inventors: Yuzo Yamamoto; Masaki Iwasaki, both of Wakayama; Tomoyuki Haishi, Kyoto; Hiromitsu Hayashi; Yumi Rakue, both of Wakayama, all of Japan

[73] Assignee: Kao Corporation, Tokyo, Japan

[ * ] Notice: The portion of the term of this patent subsequent to Oct. 27, 2009 has been disclaimed.

[21] Appl. No.: 527,773

[22] Filed: May 24, 1990

[30] Foreign Application Priority Data

May 31, 1989 [JP] Japan .................................. 138033
May 31, 1989 [JP] Japan .................................. 138034

[51] Int. Cl.$^5$ .......................... H01B 1/20; H01B 1/22
[52] U.S. Cl. .................................. 252/512; 252/513; 252/514; 523/457; 523/458; 523/459; 524/439; 524/440; 524/441
[58] Field of Search ................ 252/512, 513, 514; 524/439, 440, 441; 428/411; 523/457, 458, 459

[56] References Cited

FOREIGN PATENT DOCUMENTS

| | | |
|---|---|---|
| 55-29276 | 9/1975 | Japan . |
| 59-66129 | 4/1984 | Japan . |
| 60-193349 | 10/1985 | Japan . |
| 60-260663 | 12/1985 | Japan . |
| 61-72045 | 4/1986 | Japan . |
| 61-237435 | 10/1986 | Japan . |
| 62-13473 | 1/1987 | Japan . |
| 62-32158 | 2/1987 | Japan . |
| 62-61336 | 3/1987 | Japan . |
| 62-218413 | 9/1987 | Japan . |
| 62-253675 | 11/1987 | Japan . |
| 63-15497 | 1/1988 | Japan . |
| 63-83178 | 4/1988 | Japan . |

Primary Examiner—Mark L. Bell
Assistant Examiner—Anthony J. Green
Attorney, Agent, or Firm—Birch, Stewart, Kolasch & Birch

[57] ABSTRACT

An electrically conductive paste composition comprises an electrically conductive powder, an organic binder comprising a polymer of a hydroxystyrene having the formula (A) or a copolymer of hydroxystyrene having the formula (B), said polymer and copolymer each having a weight-average molecular weight of 1,000 to 2,000,000, and a solvent. In the formula, Y and Z are an amine group and others.

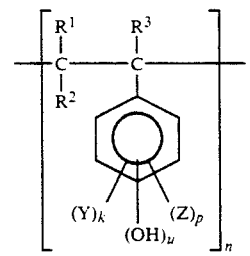

(A)

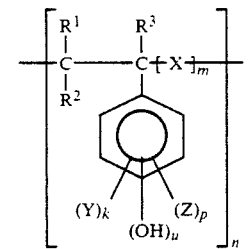

(B)

6 Claims, No Drawings

ELECTRICALLY CONDUCTIVE PASTE COMPOSITION

BACKGROUND OF THE INVENTION

The present invention relates to a conductive paste exhibiting an excellent conductivity for a long period of time, and more particularly to a conductive paste which can form a conductive coating having an excellent conductivity for a long period of time through application of the conductive paste on a circuit board, such as a paper-phenolic resin board or a glass-epoxy resin board, by screen printing or the like, followed by heat curing. The conductive pulse is suitable for use in applications such as a conductor as a countermeasure against an electromagnetic wave noise of a circuit board or a conductor for wiring a circuit board.

Prior Art

In general, a conductive paste mainly comprises an organic binder, such as an epoxy resin, a saturated polyester resin, an acrylic resin or a phenolic resin (hereinafter simply referred to as the "binder"), a conductive powder and a solvent.

The above-described conductive paste has hitherto been used as a conductor for a circuit board. In recent years, an attempt has been made on the application of the conductive paste as an electromagnetic wave shielding material for a printed circuit board. Specifically, in this application, a printed circuit board comprises a board and formed thereon, a conductive layer having a circuit pattern including an earth pattern, wherein an insulated layer is formed on the surface of the board by means of printing to cover the conductive layer, except for an earth pattern portion of the surface of the board having a conductive layer formed thereon. A conductive paste is then applied thereto by means of printing to cover the insulating layer and connect with the earth pattern, thereby forming an electromagnetic wave shielding layer for use as a conductor of a circuit board for preventing an electromagnetic wave noise (see Japanese Patent Laid-Open No. 15497/ 1988 and Japanese Utility Model Laid-Open No. 29276/ 1980).

Attention has been drawn to conductive pastes, particularly a conductive copper paste as a conductor alternative to an expensive conductive silver paste. However, the conductive copper paste has the drawback that copper is more susceptible to oxidation than silver, so that although it is more inexpensive than the conductive silver paste, there arises a severe problem from a practical viewpoint as to the maintenance of the conductivity for a long period of time in the form of a paste or a heat-cured film.

Further, the conductive paste is generally insufficient in the adhesion to the metal or the insulating layer on the circuit board and therefore lacks in the reliability when used as a conductor of an electromagnetic wave shielding layer of a circuit board for preventing electromagnetic wave noise and a wiring conductor of a circuit board.

Various antioxidants and reducing agents have hitherto been added for the purpose of overcoming the above-described drawbacks. For example, addition of an anthracene derivative and an organic titanium compound to a conductive copper paste has been proposed for improving the prevention of oxidation. However, neither sufficient conductivity nor long-term stability of the conductivity has been attained as yet.

Examples of the method of improving the binder include a method wherein use is made of a melamine resin and a polyol and a polyester resin and/or an alkyd resin to improve the adhesion to the metal and the insulating layer (see Japanese Patent Laid-Open No. 253675/1987), a method wherein use is made of a mixture of a melamine resin with an acrylic resin to improve the adhesion to the metal (see Japanese Patent Laid-Open No. 83178/1988), and a method wherein use is made of poly-p-hydroxystyrene to improve the adhesion to the insulating layer as well as the releasability with the use of a solvent (see Japanese Patent Laid-Open No. 260663/1985). However, none of the above-described methods are satisfactory in the improving the adhesion, so that the adhesion to the metal and the insulating layer cannot be ensured.

SUMMARY OF THE INVENTION

In view of the above-described circumstances, extensive and intensive stud have been made with a view to toward improving the oxidation stability, and adhesion to a board with respect to a conductive paste and as a result have found that the use of a binder composed of a polyhydroxystyrene derivative comprising polyhydroxystyrene having various substituents introduced thereinto serves to enhance the affinity for and reactivity with the metallic surface and the insulating layer surface and attain the above-described object, which has led to the completion of the present invention.

Accordingly, the present invention relates to a conductive paste comprsing a polymer or copolymer of hydroxystyrene and a suitable amount of a conductive powder as indispensable components, and a conductive coating prepared by curing said conductive paste.

According to the present invention, the regulation of the kind and density of the substituent to be introduced enables the affinity for and reactivity with the metallic surface to be controlled, so that it is possible to enhance the oxidation stability of the conductive powder as well as the adhesion to the metal and the insulating layer.

The electrically conductive paste composition of the present invention comprises an electrically conductive powder, an organic binder comprising a polymer of a hydroxystyrene having the formula (A) or a compolymer of hydroxystyrene having the formula (B), said polymer and copolymer reach having a weight-average molecular weight of 1,000 to 2,000,000, and a solvent.

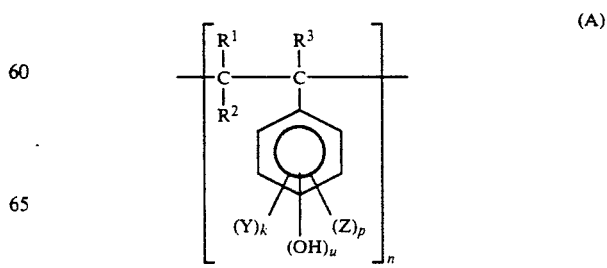
(A)

-continued

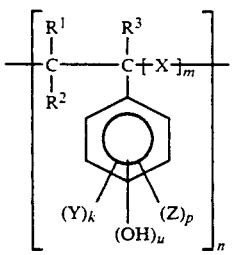

(B)

wherein m and n are each an arbitrary number, provided that $m>0$ and $n \geq 3$ and provides a weight average molecular weight of the organic polymer represented by the general formula (A) of up to 2,000,000;

$0 \leq k \leq 2$;
$0 \leq p \leq 2$;
$1 \leq u \leq 2$, provided that $k+p+m>0$; and $k+p+u>1$;

$R^1$ to $R^3$ are each hydrogen or an alkyl group having 1 to 5 carbon atoms;

X is a polymerizable vinyl monomer;

Y and Z may be the same or different and are each selected from among:

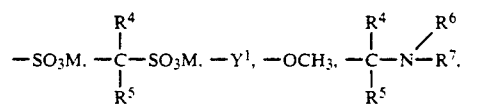

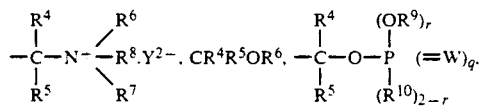

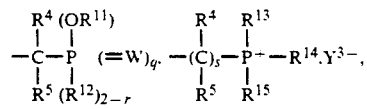

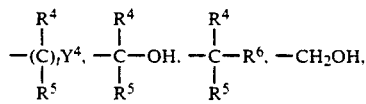

alkyl groups having 1 to 18 carbon atoms and aryl groups, wherein M is hydrogen, an alkali metal, an alkaline earth metal or an organic cation of an amine etc.;

$Y^1$ and $Y^4$ are each a halogen;

$Y^2-$ to $Y^3-$ are each a counter ion such as a halogen, an organic acid anion or an inorganic acid anion;

W is sulfur or oxygen;

$R^4$ to $R^8$ may be the same or different and are each a straight-chain or branched alkyl group or an alkyl group derivative, such as a hydroxyalkyl group, an aromatic group or hydrogen, provided that $R^4$ and $R^7$ may be combined with nitrogen to form a ring;

$R^9$ to $R^{15}$ may be the same or different and are each a straight-chain or branched alkyl group or an alkyl group derivative, such as a hydroxyalkyl group, an aromatic group or hydrogen;

q, s and t are each 0 or 1; and r is 0, 1 or 2, provided that the formula (A) has no $Y^1$.

It is preferable that the composition comprises 100 parts by weight of the powder and 0.1 to 60 parts by weight of the polymer or copolymer for the binder.

The composition may further comprise thermoplastic resin.

The composition may comprise 100 parts by weight of the powder, 0.1 to 60 parts by weight of the polymer or copolymer for the binder and a thermoplastic resin, the sum total of the polymer and copolymer and the thermoplastic resin ranging from 5 to 85 parts by weight.

It is preferable that the formulae (A) and (B), Y and Z are each an amine group having the following formula:

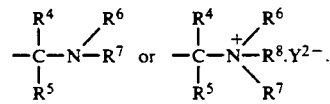

It is preferable that the polymer and copolymer has a weight-average molecular weight of 4,000 to 80,000.

The invention provides an electric parts which comprises a substrate and the electrically conductive paste composition, coated on the substrate.

Examples of the binder component include polyhydroxystyrene derivatives represented by the following general formula (A):

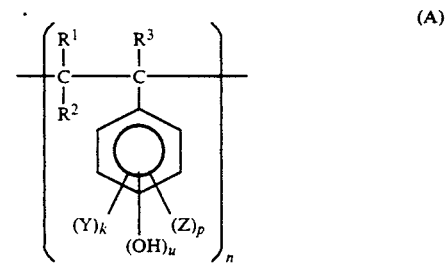

(A)

wherein n is an arbitrary number, provided that $n \geq 3$ and provides a weight average molecular weight of the organic polymer represented by the general formula (A) of up to 2,000,000;

$0 \leq k \leq 2$;
$0 \leq p \leq 2$;
$1 \leq u \leq 2$, provided that $k+p+u>1$;

$R^1$ to $R^3$ are each hydrogen or an alkyl group having 1 to 5 carbon atoms;

Y and Z may be the same or different and are each selected from among:

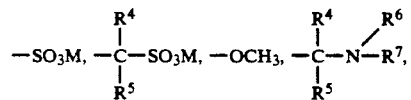

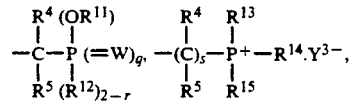

-continued

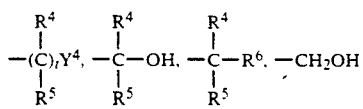

alkyl groups having 1 to 18 carbon atoms and aryl groups, wherein M is hydrogen, an alkali metal, an alkaline earth metal or an organic cation of an amine etc.;

$R^4$ is a halogen;

$Y^2-$ to $Y^3-$ are each a counter ion such as a halogen, an organic acid anion or an inorganic acid anion;

W is sulfur or oxygen;

$R^4$ to $R^8$ may be the same or different and are each a straight-chain or branched alkyl group or an alkyl group derivative, such as a hydroxyalkyl group, an aromatic group or hydrogen, provided that $R^4$ and $R^7$ may be combined with nitrogen to form a ring;

$R^9$ to $R^{15}$ may be the same or different and are each a straight-chain or branched alkyl group or an alkyl group derivative, such as a hydroxyalkyl group, an aromatic group or hydrogen;

q, s and t are each 0 or 1; and r is 0, 1 or 2.

In the above-described general formula (A), n, k and p are each not limited to an integer and may be an arbitrary number (real number) falling within a given range. In the case of a monomer constituting a polymer, it is a matter of course that n, k and p are each an integer. Since, however, the polymer is substantially in the form of a mixture, it is proper to deem the property of the polymer as the property of the mixture rather than that of the individual constituting units. For this reason, in the present invention, the formula (A) represents the average composition.

The polyhydroxystyrene derivative represented by the above-described general formula (A) may be a homopolymer of a hydroxystyrene derivative, such as hydroxystyrene, isopropenylphenol(hydroxy-α-methylstyrene) or hydroxy-α-ethylstyrene, optionally having a substituent represented by Y or Z in the general formula (A). Although a polymer unit such as hydroxystyrene or isopropenylphenol may be an ortho, meta or para isomer or a mixture thereof, the para or meta isomer is preferred.

Examples of the binder component include hydroxystyrene derivatives represented by the following general formula (B) and their derivatives:

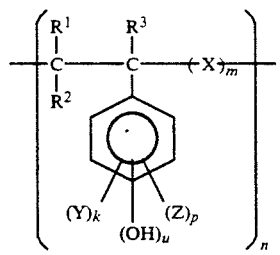

(B)

wherein m and n are each an arbitrary number, provided that $m>0$ and $n \geq 3$ and provides a weight average molecular weight of the organic polymer represented by the general formula (B) of up to 2,000,000;

$0 \leq k \leq 2$;

$0 \leq p \leq 2$;

$1 \leq u \leq 2$, provided that $k+p+m>0$;

$R^1$ to $R^3$ are each hydrogen or an alkyl group having 1 to 5 carbon atoms;

X is a polymerizable monomer;

Y and Z may be the same or different and are each selected from among;

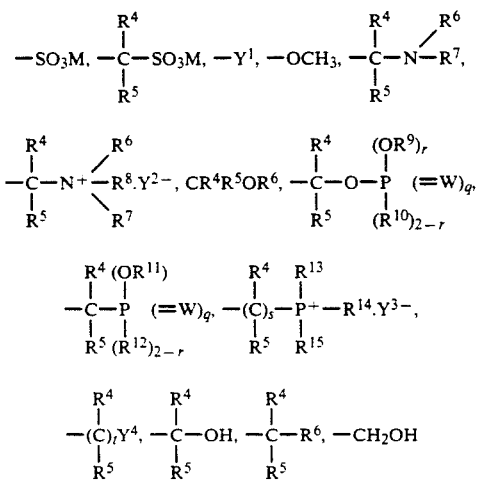

alkyl groups having 1 to 18 carbon atoms and aryl groups, wherein M is hydrogen, an alkali metal, an alkaline earth metal or an organic cation of an amine etc.;

$Y^1$ and $Y^4$ are each a halogen;

$Y^2-$ to $Y^3-$ are each a counter ion such as a halogen, an organic acid anion or an inorganic acid anion;

W is sulfur or oxygen;

$R^4$ to $R^8$ may be the same or different and are each a straight-chain or branched alkyl group or an alkyl group derivative, such as a hydroxyalkyl group, an aromatic group or hydrogen, provided that $R^4$ and $R^7$ may be combined with nitrogen to form a ring;

$R^9$ to $R^{15}$ may be the same or different and are each a straight-chain or branched alkyl group or an alkyl group derivative, such as a hydroxyalkyl group, an aromatic group or hydrogen;

q, s and t are each 0 or 1; and r is 0, 1 or 2.

In the above-described general formula (B), m, n, k and p are each not limited to an integer and may be an arbitrary number (real number) falling within a given range. For a monomer constituting a polymer, it is a matter of course that k and p are each an integer. For each block of constituent units, m is an integer, and for each molecule, n is an integer. Since, however, the polymer is substantially in the form of a mixture, it is proper to deem the property of the polymer as the property of the mixture rather than that of individual constituting units. For this reason, in the present invention, the formula (B) represents the average composition.

The hydroxystyrene copolymer and/or its derivative represented by the above-described general formula (B) may be a copolymer of hydroxystyrene, isopropenylphenol(hydroxy-α-methylstyrene) or hydroxy-α-ethylstyrene, optionally having a substituent represented by Y or Z in the general formula (B), among themselves, or a copolymer of the above-described hydroxystyrene monomer with other polymerizable vinyl monomer (X). Although a polymer unit such as hydroxystyrene or isopropenylphenol may be an ortho, meta or para isomer or a mixture thereof, the para or meta isomer is preferred.

Examples of the other vinyl monomer (X) in the case of the copolymer include ionic monomers such as anionic and cationic monomers and known compounds such as methacrylate, vinyl ester, vinyl ether, maleate, fumarate and α-olefin.

Specific examples of the above-described compounds include at least one monomers selected from the group consisting of unsaturated carboxylic acid monomers such as acrylic acid, methacrylic acid, crotonic acid, itaconic acid, maleic acid, fumaric acid, citraconic acid or their anhydrides and monoalkyl esters, carboxyethyl vinyl ether and carboxypropyl vinyl ether, unsaturated sulfonic acid monomers such as styrenesulfonic acid, allylsulfonic acid, 2-acrylamido-2-methylpropanesulfonic acid, unsaturated phosphorus acid monomers such as vinylphosphonic acid, vinyl phosphate, ethyl acrylate phosphate and ethyl methacrylate phosphate, α,β-unsaturated carboxylic acid amides such as acrylamide, methacrylamide, maleamide and maleimide, α,β-unsaturated carboxylic acid esters such as methyl acrylate, methyl methacrylate, ethyl acrylate, ethyl methacrylate, butyl acrylate, butyl methacrylate, perfluoroalkylethyl methacrylate, stearyl methacrylate, hydroxyethyl acrylate, hydroxypropyl acrylate, 2-aminoethyl methacrylate hydrochloride, dimethylaminoethyl methacrylate, methoxymethyl methacrylate, chloromethyl methacrylate, dichlorotriazinylaminoethyl methacrylate and diesters of maleic acid, fumaric acid and itaconic acid, substituted amides of unsaturated carboxylic acids such as methylolacrylamide and methoxymethylacrylamide, nitriles of α,β-unsaturated carboxylic acids, vinyl acetate, vinyl chloride and vinyl chloroacetate, and further divinyl compounds such as divinylbenzene, vinylidene compounds, aromatic vinyl compounds including styrene, heterocyclic vinyl compounds including vinylpyridine and vinylpyrrolidone, vinyl ketone compounds, vinyl ether compounds, vinylamides, monoolefin compounds such as ethylene and propylene, conjugated diolefin compounds such as butadiene, isoprene and chloroprene, allyl compounds such as allyl alcohol and allyl acetate, and glycidyl methacrylate. The proportion of the hydroxystyrene unit, such as hydroxystyrene or isopropenylphenol unit, relative to other vinyl monomer is preferably 1/10 to 20/1.

The polymer (A) and the copolymer (B) are called polyhydroxystyrene derivative.

Li, Na, K, Mg, Ca, Sr, Ba, etc. are suitable as M, i.e., an alkali metal or an alkaline earth metal, in the substituent —SO₃M or

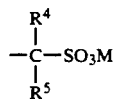

of the hydroxystyrene unit. The sulfonic acid group can be introduced by a customary sulfonation method wherein fuming sulfuric acid or sulfuric anhydride is used as a sulfonating agent. $R^4$ to $R^8$ in the substituent

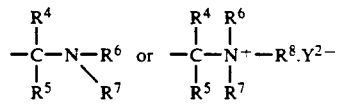

of the hydroxystyrene unit may be the same or different and are each selected from among straight-chain and branched alkyl groups having 1 to 36 carbon atoms, alkyl derivative groups, such as hydroxyalkyl, aminoalkyl, phosphoalkyl and mercaptoalkyl groups, and aromatic groups substituted with a straight-chain or branched alkyl group having 1 to 16 carbon atoms, such as group, and $R^6$ and $R^7$ may be combined together to form a ring. Preferred examples of $R^4$ to $R^8$ include straight-chain and branched alkyl groups, hydroxyalkyl groups, and aromatic groups substituted with a straight-chain or branched alkyl group having 1 to 5 carbon atoms. The introduction of the above-described tertiary amino group, e.g.,

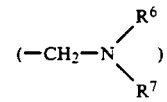

can easily be effected by Mannich reaction wherein a dialkylamine and formamide are used.

The introduction of the quaternary ammonium groups, e.g.,

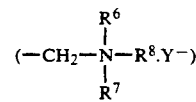

can easily be effected by Menshutkin reaction of the above-described tertiary amination product with an alkyl halide.

$R^9$ to $R^{15}$ in the substituent

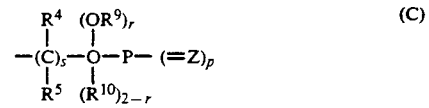

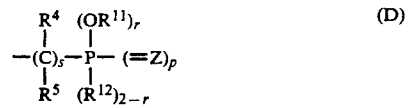

of the hydroxystyrene unit may be the same or different and are each selected from among hydrogen, straight-chain and branched alkyl groups having 1 to 36 carbon atoms, alkyl derivative groups, such as hydroxyalkyl, aminoalkyl, mercaptoalkyl and phosphoalkyl groups and aromatic groups such as a phenyl group substituted with a straight-chain or branched alkyl group having 1 to 16 carbon atoms, and preferred examples thereof include straight-chain and branched alkyl groups having 1 to 8 carbon atoms, hydroxyalkyl groups and aromatic groups substituted with a straight-chain or branched alkyl group having 1 to 5 carbon atoms. The polyhydroxystyrene derivative represented by the formula (D) is prepared by a method disclosed in, e.g., Japanese Patent Laid-Open No. 47489/1978, i.e., by halogenating or halomethylating a hydroxystyrene polymer and reacting the product with a trivalent phosphorus compound (Arbusow reaction) and conducting thermal rearrangement of the reaction product. The polyhydroxystyrene derivative represented by the formula (C) is prepared by a method disclosed in, e.g., Japanese Patent Laid-Open No. 71190/1978, i.e., by methylolating a hydroxystyrene polymer and reacting the product with a compound having a phosphoric acid or phosphoric ester group introduced thereinto. The polyhydroxystyrene derivative containing as a substituent a phosphonium group represented by the formula:

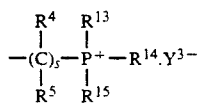

can easily be prepared by a method disclosed in, e.g., Japanese Patent Laid-Open No. 34444/1986, i.e., by reacting a hydrogen halide and formaldehyde with a hydroxystyrene polymer to conduct halogenomethylation (e.g., introduction of —$CH_2Cl$) and then reacting a trivalent phosphorous ester with the product.

The polyhydroxystyrene derivative which may be used as the organic binder component in the present invention is limited to one having a weight average molecular weight of 1,000 to 2,000,000, preferably 1,000 to 1,000,000. This is because the effect of the present invention is influenced by the molecular weight of the polyhydroxystyrene derivative, and when the polyhydroxystyrene derivative has a molecular weight as low as less than 1,000, it is difficult to attain the oxidation stability of the conductive powder, while when the molecular weight exceeds 2,000,000, no excellent conductivity can be attained.

The polar groups such as an amino, phosphate or sulfonate group (except for a hydroxy group and aromatic rings) are important particularly for enhancing the affinity and reactivity of the polyhydroxystyrene derivative with a metallic powder, and the average polar group density is preferably 0.01 to 5 per 500 of the molecular weight. When the polar group density is less than 0.01, there arises a problem of poor affinity for the metallic powder, while when the density exceeds 5, the corrosion resistance of the paste lowers. A polar group derived from an amino, methylol or phosphoric acid group is preferred from the viewpoint of improving the corrosion resistance of the conductive powder. The hydroxyl group is important for improving the corrosion resistance and the adhesion to the insulating layer, and a better effect can be attained when the hydroxyl group is directly attached as a substituent and the number of hydroxy groups is larger. The molecular weight, constituent units, kind and density of the polar group, kind of the main chain, etc., of the above-described polyhydroxystyrene derivative are important factors which play an essential role for the binder of the conductive paste of the present invention.

Since most of the polyhydroxystyrene derivatives are a thermoplastic resin, it is preferred to use them in combination with a thermosetting resin. When the thermosetting resin is used, proportions of blending the components vary depend upon the purpose of use of the paste. However, the amount of the polyhdyroxystyrene derivative is 0.1 to 60 parts by weight, preferably 1 to 45 parts by weight, still preferably 5 to 35 parts by weight based on 100 parts by weight of the conductive powder, and the total amount of the thermosetting resin and the polyhydroxystyrene derivative is preferably 5 to 85 parts by weight.

Examples of the thermosetting resin useful in the present invention include known thermosetting resins such as phenolic resin, urea resin, amino resin, alkyd resin, silicone resin, furan resin, unsaturated polyester resin, epoxy resin, and polyurethane resin. The phenolic resin, amino resin and epoxy resin are particularly preferred.

Examples of the phenolic resin include a resin prepared by conducting the addition and condensation of a compound having a phenolic hydroxyl group, such as phenol, cresol, xylenol, p-alkylphenol, chlorophenol, bisphenol A, phenolsulfonic acid and resorcinol, with an aldehyde, such as formalin or furfural. A resol type phenolic resin is particularly preferred. When a novolak type phenolic resin is used, it is preferred to use the resin in combination with hexamethylenetetramine.

Examples of the amino resin include a resin prepared by the addition and condensation of an amino group of urea, melamine, guanamine, aniline or sulfonamide with formalin, and an alkyl-etherified melamin resin is preferred.

Examples of the alkyl-etherified melamine resin include products of Dainippon Ink and Chemicals, Inc., such as methylmelamine resin of Superbeckamine L-105-60, n-butylated melamine resins of Superbeckamine J-820-60, J-840, L-117-60, L-127-60 and L-109-50, and iso-butylated melamine resins of Superbeckamine G-821-60, L-118-60, L-121-60, TD-139-60, L-110-60, L-125-60, 47-508,60, L-145-60 and L-116-70 (all of which are trade names).

A diepoxide of a bisphenol is preferred as the epoxy resin, and examples thereof include Epikote 827, 828, 834, 1001, 1002, 1004, 1007 and 1009, products of Shell Kagaku K.K., DER 330, 331, 332, 334, 335, 336, 337, 660, 661, 662, 667, 668 and 669, products of Dow Chemical Co., Araldite GY 250, 260, 280, 6071, 6084, 6097 and 6099, products of Ciba-Geigy Ltd., EPI-RE 2510 and 5101 products of Jones Dabney Inc., Epiclon 810, 1000, 1010 and 3010, products of Dainippon Ink and Chemicals, Inc. (all of which are traded names), and EP series, products of Asahi Denka Kogyo Co., Ltd. Further, the epoxy resin may be one having an average number of epoxy groups of 3 or more, e.g., a novolak epoxy resin. The novolak epoxy resin preferably has a molecular weight of 500 or more. Examples of the novolak epoxy resin of this kind manufactured on a commercial scale include Araldite EPN 1138 and 1139, ECN 1273, 1280 and 1299, products of Ciba-Geigy Ltd., DEN 431 and 438 products of Dow Chemical Co., Epikote 152 and 154, products of Shell Kagaku K.K., ERR-0100 and ERRB-0447 and ERLB-0488, products of Union Carbide Corp. and EOCN series, products of Nippon Kayaku Co., Ltd. If necessary, it is possible to use a curing catalyst and a diluent for an epoxy resin. Examples of the curing catalyst for an epoxy resin include aliphatic amines such as diethylenetriamine, triethylenetetramine and tetramethylenepentamine, aromatic amines such as benzyldimethylamine, diaminodiphenylmethane and diaminodiphenyl sulfone, acid anhydrides such as maleic anhydride, phthalic anhydride, hexahydrophthalic anhydride and methyl nadic anhydride, p-dimethylaminobenzaldehyde, boron trifluoride-piperidine complex. Examples of the diluent for an epoxy resin include reactive diluents such as n-butyl glycidyl ether, octylene oxide, phenyl glycidyl ether, styrene oxide, allyl glycidyl ether and methacrylglycidyl, non-reactive diluents such as dibutyl phthalate, dioctyl phthalate, tricresyl phosphate, triacetate, xylene, castor oil and pine oil, and semi-reactive diluents such as alkyl(nonyl)phenol, polyglycol, polysulfide, styrene diallyl phthalate, ε-caprolactam and butyrolactone.

The above-described thermosetting resins of the present invention may be used alone or in the form of a mixture of two or more of them.

In the present invention, the proportion of the binder is 5 to 85 parts by weight, preferably 10 to 45 parts by weight based on 100 parts by weight of the conductive powder. When the proportion is less than 5 parts by weight, the absolute amount of the binder is insufficient, which renders the flowability of the resultant composition poor, so that the printability is lowered. Further, this makes the conductive powder liable to be oxidized during heat curing operation, so that the conductivity lowers. On the other hand, when the amount of the binder exceeds 85 parts by weight, the absolute amount of the conductive powder becomes insufficient, which makes it impossible to attain a conductivity necessary for forming a circuit.

At least one additive selected from among saturated and unsaturated fatty acids and their metallic salts and higher aliphatic amines may be incorporated in the conductive paste of the present invention for the purpose of preventing the oxidation of the conductive powder or imparting dispersibility to the conductive powder. Examples of the saturated fatty acid include palmitic acid, stearic acid and arachic acid, and preferred examples of the unsaturated fatty acid include oleic acid and linoleic acid. Examples of their metallic salts include sodium and potassium salts. It is also possible to use vegetable oils containing 60% or more of an unsaturated fatty acid, such as soybean oil, sesame oil, olive oil or safflower oil. The amount of addition of the vegetable oil is 0.1 to 20 parts by weight, preferably 0.5 to 10 parts by weight based on 100 parts by weight of the conductive powder. When the amount is less than 0.1 part by weight, no significant effect can be attained by the addition, while when the amount exceeds 20 parts by weight, not only any improvement in the dispersibility corresponding to the amount of addition cannot be attained but also the conductivity and durability of the formed coating are lowered unfavorably.

The higher aliphatic amine used in the present invention may be any organic compound having an amino group, and it may have other substituent. For example, it may be an α-olefin-derived amine having a hydroxyl group. However, since it should be used in combination with the conductive powder, e.g., a solid insoluble in a solvent cannot be used. A higher aliphatic amine having 8 to 22 carbon atoms is preferred. Examples of the higher amine include saturated amines such as stearylamine, palmitylamine, behenylamine, cetylamine, octylamine, decylamine and laurylamine, unsaturated monoamines such as oleylamine, and diamines such as stearylpropylenediamine and oleylpropylenediamine.

In the present invention, it is preferred to use the higher aliphatic amines in a total amount of 0.1 to 10 parts by weight based on 100 parts by weight of the conductive powder.

In the conductive paste of the present invention, at least one known reducing agent may be optionally used for the purpose of preventing oxidation of the conductive powder. Preferred examples of the reducing agent include inorganic reducing agents such as phosphorous acid and hypophosphorous acid and organic and inorganic compounds such as hydroquinone, catechols, ascorbic compounds, hydrazine compounds, formalin, borohydride compounds and reducing sugars.

In the present invention, when the reducing agent is used, the amount thereof is generally 0.1 to 20 parts by weight, preferably 0.5 to 10 parts by weight based on 100 parts by weight of the conductive powder.

Examples of the conductive powder used in the present invention include metallic powders, such as copper, silver, nickel and aluminum powders, and powders having a coating layer of the above-described metal on the surface thereof. Although it may be in any of arborescent, flaky, spherical and amorphous forms, the mean particle diameter is preferably 100 μm or less, still preferably about 1 to 30 μm. When the mean particle diameter exceeds 30 μm, it becomes difficult to conduct high-density filling of the conductive powder, which brings about lowering in the conductivity and deterioration of the printability. The above-described conductive powders may be used alone or in the form of a mixture thereof. It is preferred that the purity of the above-described metallic powder be high. In particular, for copper powder, it is most desirable that the purity thereof be the same as that of a copper foil or a plated copper layer used in a conductor of a circuit board.

The function and effect of the polyhydroxystyrene derivative of the present invention is more significantly exhibited when the metallic copper powder is used, which renders the present invention important particularly for the production of a conductive copper paste.

The amount of blending of the conductive powder is 50 to 95% by weight, preferably 60 to 90% by weight, still preferably 70 to 85% by weight in a cured coating state. When the amount of blending is less than 50% by weight, no sufficient conductivity can be attained. On the other hand, when the amount of blending exceeds 95% by weight, the conductive powder cannot be sufficiently bound and the formed coating is fragile, so that not only the durability of the coating lowers but also the screen printability deteriorates.

The conductive paste of the present invention is prepared, e.g., by dissolving a polyhydroxystyrene derivative in a solvent, adding a thermosetting resin and a conductive powder to the resultant solution and sufficiently kneading the mixture by means of a disperser, a ball mill, a three-roll mill, etc.

The solvent which may be used herein include known solvents, e.g., benzene, toluene, hexanone, dioxane, solvent naphtha, industrial gasoline, cellosolve acetate, ethyl cellosolve, butyl cellosolve, butyl cellosolve acetate, butyl carbitol acetate, dimethylformamide, dimethylacetamide, N-methylpyrrolidone, alcoholic solvents such as isopropyl alcohol and butanol, and ketonic solvents such as methyl ethyl ketone and methyl isobutyl ketone. The amount of blending of the solvent varies depending upon the kind of kneader, kneading conditions and kind of solvent. It is preferred to regulate the amount of the solvent in such a manner that the paste after kneading has a viscosity falling within a range sufficient to conduct screen printing.

A circuit board for preventing the occurrence of an electromagnetic wave noise, which comprises a circuit board and an electromagnetic wave shielding layer provided thereon, can be prepared through the use of the conductive paste of the present invention, e.g., by the following method. Specifically, a heat-curable or ultraviolet-curable organic insulator is applied to a conductive circuit formed from a metal-clad laminate by the etched foil method except for an earth pattern portion, thereby providing an insulating layer. The conductive paste of the present invention is applied on substantially the entire surface of the insulating layer by screen printing in such a manner that the paste is brought into contact with the earth pattern. The resultant coating is then heat-cured to prepare a circuit board having an effective electromagnetic wave shielding layer as a countermeasure against an electromagnetic wave noise. This circuit board can usefully be utilized also as an electrostatic shielding layer Further, the conductive paste of the present invention may be used as a wiring conductor of a circuit board by the same method as that used in the art. The insulating board to which the paste is applied may be any of glass-epoxy resin, paper-phenolic resin, ceramic, polycarbonate resin, polyethylene terephthalate resin, polyimide resin, polyolefin resin, polyvinyl chloride resin, polyester resin, ABS resin, polymethyl methacrylate resin, melamine resin, phenolic resin, epoxy resin and glass boards. The wiring may be formed by screen printing, intaglio printing, spraying, brushing, etc.

The term "conductive coating" as used in the present invention is intended to mean a cured material or a cured coating having a volume resistivity of $1 \times 10^{-2}$ $\Omega$·cm or less prepared by drying and curing the conductive paste of the present invention. [Function]

The conductive paste of the present invention has the following characteristic functions 1) to 4).

1) Since the polyhhdroxystyrene derivative used as a binder component is excellent in the affinity for and reactivity with a metallic surface, a dense protective film is formed on the surface of conductive particles except for the contact portion thereof during heat curing, which contributes to an increase in the rust resistance of the metallic powder. That is, it becomes possible to maintain the conductivity for a long period of time.

2) When the conductive paste is applied on a circuit board, an adhesion to a copper foil of an earth pattern portion is improved.

3) The adhesion to an organic insulating layer is improved through the action of the polyhydroxystyrene derivative.

4) The chelating action of the polyhydroxystyrene derivative improves the rust resistance of the metallic powder in a pasty state, which enables the conductivity to be maintained for a long period of time.

As described above, a significant feature of the conductive paste of the present invention resides in the use of an organic polymer having a specific chemical structure, i.e., polyhydroxystyrene derivative, as a binder component. According to the present invention, regulation of the kind and density of the substituent to be introduced enables the affinity for and reactivity with a metallic surface to be controlled, so that it is possible to improve the oxidation stability of the conductive powder and to maintain the conductivity of the paste for a long period of time. Further, it is possible to remarkably improve the adhesion to the surface of a copper foil and an insulating layer.

Therefore, for example, the use of the conductive copper paste according to the present invention makes it possible to remarkably improve the durability (oxidation stability) and the adhesion to a board the lack of which has been a serious drawback of the conventional copper paste. The utilization of the above-described copper paste enables an electromagnetic wave shielding layer having a very high reliability and a significant effect to be easily and stably formed on a circuit board. Similarly, a wiring having a high reliability can be formed also when the paste is used as a wiring conductor of a circuit board. Further, the paste can be usefully utilized in electrodes of electronic equipment components and circuit components. The above-described effects render the present invention very useful from the industrial viewpoint.

EXAMPLES

The present invention will now be described in more detail by way of the following Examples and Comparative Examples, though the present invention is not limited to these Examples only. In the Examples and Comparative Examples, the term "parts" is intended to mean "parts by weight".

EXAMPLES

Paste preparation and printing

Each of the conductive powders listed in Table 1, each of the polyhydroxystyrene derivatives listed in Table 2, each of the thermosetting resins and additives listed in Table 3 were sufficiently kneaded together to give a composition specified in Table 4 by means of a disperser or a three-roll mill, thereby preparing conductive pastes. A pattern having a width of 2 mm and a total length of 36 m was printed on a glass-epoxy resin board through the use of the resultant conductive pastes by means of a screen printing press provided with a 180- to 250-mesh Tetoron screen. Then, the pattern was heat-cured at 140° to 160° C. for 10 to 30 min to prepare a 20 to 30 μm-thick cured film of the paste.

Various characteristics examined for the conductive circuit prepared by the above-described process are given in Table 4.

Measurement of conductivity

The conductivity of the coating is expressed as a volume resistivity of the heat-cured coating by the two-terminal method through the use of a digital multimeter (R6551; mfd. by Advantest Corp.).

The volume resistivity was calculated by making use of the following equation (1):

$$\text{volume resistivity } (\Omega \cdot \text{cm}) = \frac{R \times t \times W}{L} \quad (1)$$

wherein

R is the resistance value between electrodes ($\Omega$);

t is the thickness of the coating (cm);

W is the width of the coating (cm); and

L is the distance between electrodes.

Moisture resistance test

The moisture resistance of the coating was determined by allowing a sample to stand for 500 hr under environmental conditions of a temperature of 60° C. and a relative humidity of 95% and determining the percentage change in the resistance before and after the standing ($W_R$).

$$\text{Percentage change of resistance } W_R (\%) = \frac{R_{500} - R_0}{R_0} \quad (2)$$

wherein $R_0$ is the resistance value of the coating before the test ($\Omega$); and $R_{500}$ is the resistance value of the coating after the 500-hr test ($\Omega$).

The moisture resistance of the coating is expressed based on the $W_R$ value according to the following criterion:

AA: a $W_R$ value of less than 10%
A: a $W_R$ value of more than 10% to less than 30%
B: a $W_R$ value of more than 30% to less than 100%
C: a $W_R$ value of more than 100%.

Heat resistance test

The heat resistance of the coating was determined by allowing the coating to stand in the air at 100° C. for 200 hr and determining the percentage change in the resistance value ($H_R$) before and after the standing. The calculation equation is the same as the equation (2). The heat resistance of the coating is expressed based on the $H_R$ value according to the A: an $H_R$ value of less than 10%
B: an $H_R$ value of more than 10% to less than 20%
C: an $H_R$ value of more than 20%.

Evaluation of printability

The printability of each conductive paste was evaluated by screen printing through the use of a 180- to 250-mesh Tetoron screen. Evaluation criterion is as follows:

○: well printable
Δ: printable in a way
x: non-printable

Adhesion test

The conductive paste of the present invention was applied to a copper foil and an organic insulating layer (SSR 671G mfd. by Sanei Kagaku Co., Ltd. or S40 mfd. by Taiyo Ink Mfg. Co., Ltd.) by screen printing in a coating thickness of 20 to 30 μm and subjected to the above-described moisture resistance test. Then, according to the squares test method as stipulated by JIS K 5400 (1979), 11 horizontal scratches and 11 vertical scratches were made orthogonally to each other at intervals of 1 mm on the coating to form 100 squares per cm². A cellophane tape was put thereon to tear off the coating, and the number of coating squares remaining on the copper foil or organic insulating layer was determined. Evaluation criterion is as follows:

◎: 100/100
○: 90/100 or more to less than 100/100
Δ: 50/100 or more to less than 90/100
x: 0/100 or more to less than 10/100

COMPARATIVE EXAMPLES

Conductive pastes each having a composition as specified in Table 4 were prepared, and a conductor was formed on a board in the same manner as that of the Examples. The coating was subjected to measurement of the volume resistivity, and the moisture resistance, heat resistance, printability and adhesion thereof were examined. The results are given in Table 4.

TABLE 1

| Symbol | Kind | Form | Mean particle diameter (μm) |
|---|---|---|---|
| Cu-6 | copper powder | arborescent | 6 |
| Cu-10 | copper powder | arborescent | 10 |
| Cu-20 | copper powder | arborescent | 20 |
| Ni | nickel powder | spherical | 3 |
| Ag | silver powder | scaly | 0.6 |

TABLE 2

| No. | Structure of polyhydroxystyrene derivative | Weight average molecular weight ($\overline{MW}$) |
|---|---|---|
| 1 | 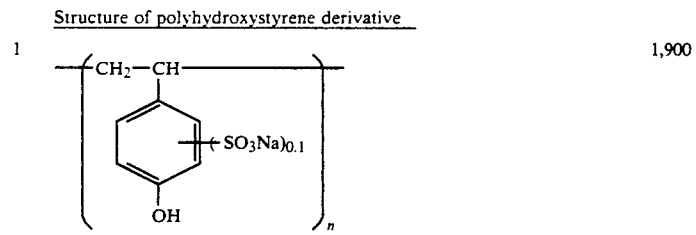 | 1,900 |
| 2 | 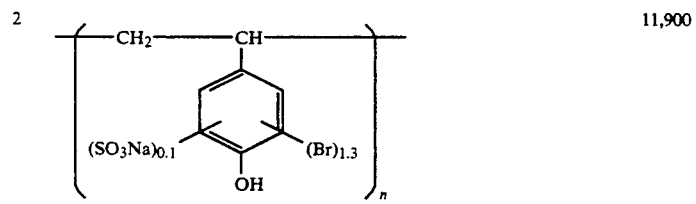 | 11,900 |
| 3 | 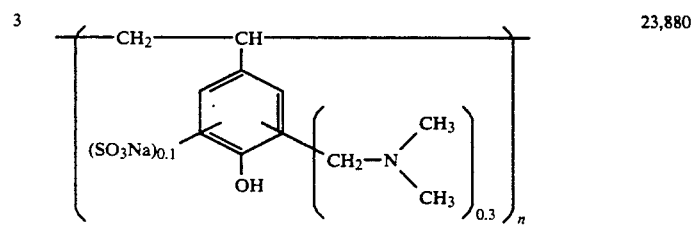 | 23,880 |

TABLE 2-continued

| No. | Structure | Weight average molecular weight ($\overline{MW}$) |
|---|---|---|
| 4 | $\left[\!\!-CH_2-CH-\!\!\underset{\underset{OH}{\phantom{x}}}{\overset{\phantom{x}}{\bigcirc}}\!\!-(OCH_3)_{1.0}\right]_n$ | 3,860 |
| 5 | $\left[\!\!-CH_2-\overset{CH_3}{\underset{\phantom{x}}{C}}-\!\!\underset{\underset{OH}{\phantom{x}}}{\overset{\phantom{x}}{\bigcirc}}\!\!\left(CH_2-\overset{O}{\underset{\phantom{x}}{P}}\overset{OC_2H_5}{\underset{OC_2H_5}{\phantom{x}}}\right)_{0.2}\right]_n$ | 4,070 |
| 6 | $\left[\!\!-CH_2-CH-\!\!\underset{\underset{OH}{\phantom{x}}}{\overset{\phantom{x}}{\bigcirc}}\!\!\left(CH_2-\overset{O}{\underset{\phantom{x}}{P}}\overset{CH_3}{\underset{CH_3}{\phantom{x}}}\right)_{0.2}\right]_n$ | 3,490 |
| 7 | $\left[\!\!-CH_2-CH-\!\!\underset{\underset{OH}{\phantom{x}}}{\overset{\phantom{x}}{\bigcirc}}\!\!\left(\overset{O}{\underset{\phantom{x}}{P}}\overset{OC_2H_5}{\underset{OC_2H_5}{\phantom{x}}}\right)_{0.1}\right]_n$ | 2,600 |
| 8 | $\left[\!\!-CH_2-CH-\!\!\underset{\underset{OH}{\phantom{x}}}{\overset{\phantom{x}}{\bigcirc}}\!\!-\overset{CH_3}{\underset{\underset{CH_3}{CH_3}}{C}}\right]_n$ | 100,000 |
| 9 | $\left[\!\!-CH_2-CH-\!\!\underset{\underset{OH}{\phantom{x}}}{\overset{\phantom{x}}{\bigcirc}}\!\!-\overset{\phantom{x}}{\underset{CH_3}{CH}}-\bigcirc\right]_n$ | 17,000 |
| 10 | $\left[\!\!-CH_2-CH-\!\!\underset{\underset{OH}{\phantom{x}}}{\overset{\phantom{x}}{\bigcirc}}\!\!\left(CH_2-N\overset{CH_3}{\underset{CH_3}{\phantom{x}}}\right)_{0.2}\right]_n$ | 2,200 |

TABLE 2-continued

| No. | Structure | Weight average molecular weight ($\overline{MW}$) |
|---|---|---|
| 11 | $\left[\text{CH}_2\text{-CH}\left(\text{C}_6\text{H}_3(\text{OH})(\text{CH}_2\text{N}(\text{CH}_3)_2)_{0.5}\right)\right]_n$ | 15,000 |
| 12 | $\left[\text{CH}_2\text{-CH}\left(\text{C}_6\text{H}_3(\text{OH})(\text{CH}_2\text{-morpholino})_2\right)\right]_n$ | 7,300 |
| 13 | $\left[\text{CH}_2\text{-CH}(\text{C}_6\text{H}_4(\text{OH})_{1.6})\right]_n$ | 8,400 |
| 14 | $\left[\text{CH}_2\text{-CH}\left(\text{C}_6\text{H}_3(\text{OH})_{1.4}(\text{P(=O)(OC}_2\text{H}_5)_2)_{0.1}\right)\right]_n$ | 4,200 |
| 15 | $\left[\text{CH}_2\text{-CH}\left(\text{C}_6\text{H}_3(\text{OH})(\text{CH}_2\text{OH})_{0.3}\right)\right]_n$ | 1,850 |

Structure of hydroxystyrene copolymer and/or its derivative

| No. | Structure | Weight average molecular weight ($\overline{MW}$) |
|---|---|---|
| B1 | $\left[\text{CH}_2\text{-CH}(\text{C}_6\text{H}_4\text{OH})\text{-}(\text{CH}_2\text{-CH(COOH)})_{0.3}\right]_n$ | 11,000 |
| B2 | $\left[\text{CH}_2\text{-CH}(\text{C}_6\text{H}_4\text{OH})\text{-}(\text{CH(COOH)-CH(COOH)})_{0.3}\right]_n$ | 25,000 |

TABLE 2-continued

| No. | Structure | Weight average molecular weight ($\overline{MW}$) |
|---|---|---|
| B3 | $\left\{ \left( CH_2-CH\left(\underset{OH}{\underset{|}{C_6H_3}}\right)-CH_2-CH(COOH) \right)_{0.5} \left( CH_2-N(CH_2CH_2OH)_2 \right)_{0.1} \right\}_n$ | 37,500 |
| B4 | $\left\{ CH_2-CH\left(\underset{OH}{\underset{|}{C_6H_4}}\right)-CH_2-C(CH_3)(COOCH_2CH_2OH) \right\}_{0.5,n}$ | 4,210 |
| B5 | $\left\{ CH_2-CH\left(\underset{OH}{\underset{|}{C_6H_3(CH_2OH)_{0.3}}}\right)-CH_2-C(CH_3)(COOCH_3) \right\}_{0.6,n}$ | 2,760 |
| B6 | $\left\{ CH_2-CH(C_6H_4OH)-CH_2-CH(C_6H_4OCH_2CH_2OH) \right\}_{0.5,n}$ | 6,210 |
| B7 | $\left\{ CH_2-CH(C_6H_4OH)-CH_2-CH(C_6H_5) \right\}_{0.3,n}$ | 300,000 |
| B8 | $\left\{ CH_2-CH(C_6H_4OH)-CH-CH(\text{N-phenylmaleimide}) \right\}_{0.5,n}$ | 14,500 |

TABLE 2-continued

| No. | Structure | Weight average molecular weight ($\overline{MW}$) |
|---|---|---|
| B9 | $\left[\!-CH_2-\underset{\underset{\substack{\displaystyle\bigcirc\\OH}}{|}}{\overset{\overset{\displaystyle CH_3}{|}}{C}}\!-\!\left(CH_2-\underset{COOH}{CH}\right)_{\!0.2}\!\left(CH_2-\underset{\underset{OC_2H_5}{\overset{O}{\|}}}{P}\!\!\overset{OC_2H_5}{\diagdown}\right)_{\!0.2}\right]_n$ (CH$_2$-P attached to phenol ring) | 8,800 |
| B10 | $\left[-CH_2-CH(\text{phenol-OH})- \left(CH_2-\underset{COOH}{\overset{CH_3}{C}}\right)_{0.2} \left(CH_2-\underset{\underset{CH_3}{\overset{O}{\|}}}{P}\overset{CH_3}{\diagdown}\right)_{0.2}\right]_n$ | 7,650 |
| B11 | $\left[-CH_2-CH(\text{C}_6\text{H}_4\text{OH}) - (CH_2-CH(\text{C}_6\text{H}_4\text{OCH}_2\text{CH}_2\text{OH}))_{0.5}\right]_n$ | 2,300 |
| B12 | $\left[-CH_2-CH(\text{C}_6\text{H}_4(\text{OH})_{1.5}) - (CH_2-CH(\text{C}_6\text{H}_4\text{OCH}_2\text{CH}_2\text{OH}))_{0.2}\right]_n$ | 6,300 |
| B13 | $\left[-CH_2-CH(\text{C}_6\text{H}_4(\text{OH})_{1.6}) - \left(CH_2-\underset{\underset{O-CH_2CH_2OH}{\overset{C=O}{|}}}{\overset{CH_3}{\underset{|}{C}}}\right)_{0.3}\right]_n$ | 3,200 |

Polymer of Comp. Ex.

16  resol type phenolic resin
17  p-tert-butylphenolic resin

| 18 | $\left[-CH_2-CH(\text{C}_6\text{H}_4\text{OH})-\right]_n$ | 9,600 |

TABLE 2-continued

| No. | | Weight average molecular weight (MW) |
|---|---|---|
| 19 | 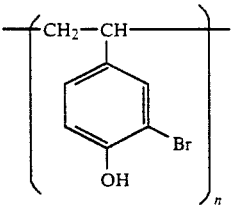 | 5,000 |

TABLE 3

| | Symbol | Compound |
|---|---|---|
| thermo-setting resin | A | Superbeckamine G-821-60 (trade name; a product of Dainippon Ink and Chemicals, Inc. [isobutylated melamine resin] (active ingredient: 60%) |
| | B | Superbeckamine L-105-60 (trade name; a product of Dainippon Ink and Chemicals, Inc. [methylated melamine resin] (active ingredient: 60%) |
| | C | Epikote 828 (trade name; a product of Shell Kagaku K.K. [epibis type epoxy resin] + curing catalyst[*1] (active ingredient: 100%) |
| | D | Epikote 1001 (trade name; a product of Shell Kagaku K.K. [epibis type epoxy resin] + curing catalyst[*1] (active ingredient: 100%) |
| additive | a | oleic acid |
| | b | sodium oleate |
| | c | linoleic acid |
| | d | palmitylamine |
| | e | stearylamine |
| | f | oleylamine |

Note: [*1] p-dimethylaminobenzaldehyde: 0.5% (based on epoxy resin)

TABLE 4

| | | Conductive paste composition (parts)[2] | | | | | | | | | | | Adhesion | |
|---|---|---|---|---|---|---|---|---|---|---|---|---|---|---|
| | | conductive powder | | binder | | | | additive | | | | | | |
| | | | | PVA derivative[1] | | thermosetting resin | | | | Volume resistivity ($\Omega \cdot cm$) | Moisture resistance | Heat resistance | Print-ability | copper foil | insulating layer |
| No. | | symbol | amt. of blending | No. | amt. of blending | symbol | amt. of blending | symbol | amt. of blending | | | | | | |
| Product of the present invention | 1 | Cu-10 | 100 | 1 | 30 | A | 30 | a | 5 | $6.3 \times 10^{-4}$ | A | A | ○ | ⊚ | ⊚ |
| | 2 | Cu-10 | 100 | 2 | 6 | B | 14 | b | 0.5 | $8.5 \times 10^{-5}$ | A | A | ○ | ⊚ | ⊚ |
| | 3 | Cu-10 | 100 | 3 | 9 | C | 11 | c | 5 | $1.0 \times 10^{-4}$ | AA | A | ○ | ⊚ | ⊚ |
| | 4 | Cu-20 | 100 | 4 | 50 | D | 29 | c | 2 | $1.1 \times 10^{-3}$ | A | A | ○ | ⊚ | ⊚ |
| | 5 | Cu-6 | 100 | 5 | 6 | B | 15 | c | 3 | $7.1 \times 10^{-5}$ | AA | A | ○ | ⊚ | ⊚ |
| | 6 | Cu-10 | 100 | 6 | 4 | A | 16 | a | 5 | $9.0 \times 10^{-5}$ | AA | A | ○ | ⊚ | ⊚ |
| | 7 | Cu-10 | 100 | 7 | 10 | C | 12 | d | 5 | $8.2 \times 10^{-5}$ | AA | A | ○ | ⊚ | ⊚ |
| | 8 | Cu-10 | 100 | 7 | 15 | C | 18 | c | 5 | $7.3 \times 10^{-5}$ | AA | A | ○ | ⊚ | ⊚ |
| | 9 | Cu-10 | 100 | 7 | 20 | C | 24 | c | 5 | $9.0 \times 10^{-5}$ | AA | A | ○ | ⊚ | ⊚ |
| | 10 | Cu-10 | 100 | 8 | 0.4 | A | 8 | b | 3 | $1.0 \times 10^{-4}$ | A | A | ○ | ⊚ | ⊚ |
| | 11 | Cu-10 | 100 | 9 | 10 | B | 15 | d | 0.3 | $2.4 \times 10^{-4}$ | A | A | ○ | ⊚ | ⊚ |
| | 12 | Cu-10 | 100 | 10 | 6 | A | 19 | b | 3 | $7.0 \times 10^{-5}$ | AA | A | ○ | ⊚ | ⊚ |
| | 13 | Cu-10 | 100 | 10 | 22 | B | 28 | e | 3 | $8.3 \times 10^{-5}$ | AA | A | ○ | ⊚ | ⊚ |
| | 14 | Cu-10 | 100 | 10 | 10 | A | 12 | f | 3 | $9.5 \times 10^{-5}$ | AA | A | ○ | ⊚ | ⊚ |
| | 15 | Cu-10 | 100 | 11 | 4.4 | B | 15.6 | e | 3 | $7 \times 10^{-5}$ | AA | A | ○ | ⊚ | ⊚ |
| | 16 | Cu-6 | 100 | 12 | 19 | C | 8 | b | 3 | $1.2 \times 10^{-4}$ | A | A | ○ | ⊚ | ⊚ |
| | 17 | Cu-10 | 100 | 13 | 6 | A | 14 | b | 3 | $5 \times 10^{-5}$ | AA | A | ○ | ⊚ | ⊚ |
| | 18 | Cu-10 | 100 | 13 | 4.5 | B | 10.5 | d | 3 | $5 \times 10^{-5}$ | AA | A | ○ | ⊚ | ⊚ |
| | 19 | Cu-10 | 100 | 14 | 6 | B | 14 | b | 3 | $6.5 \times 10^{-5}$ | AA | A | ○ | ⊚ | ⊚ |
| | 20 | Cu-10 | 100 | 14 | 12 | B | 27 | e | 3 | $8.6 \times 10^{-5}$ | AA | A | ○ | ⊚ | ⊚ |
| | 21 | Cu-10 | 100 | 15 | 6 | A | 14 | a | 5 | $7.5 \times 10^{-5}$ | AA | A | ○ | ⊚ | ⊚ |
| | 22 | Cu-10 | 100 | 15 | 7 | B | 17 | c | 5 | $5 \times 10^{-5}$ | AA | A | ○ | ⊚ | ⊚ |
| | 23 | Ni | 100 | 7 | 7 | A | 15 | f | 3 | $1.0 \times 10^{-3}$ | AA | A | ○ | ⊚ | ⊚ |
| | 24 | Ni | 100 | 10 | 14 | C | 13 | c | 5 | $9.1 \times 10^{-4}$ | AA | A | ○ | ⊚ | ⊚ |
| | 25 | Ni | 100 | 11 | 6 | D | 24 | b | 3 | $8.4 \times 10^{-4}$ | AA | A | ○ | ⊚ | ⊚ |
| | 26 | Ni | 100 | 13 | 3 | B | 12 | e | 3 | $4.3 \times 10^{-3}$ | AA | A | ○ | ⊚ | ⊚ |
| | 27 | Ag | 100 | 10 | 8 | C | 12 | d | 5 | $2.7 \times 10^{-5}$ | A | A | ○ | ⊚ | ⊚ |
| | 28 | Ag | 100 | 14 | 12 | D | 15 | b | 3 | $3.9 \times 10^{-5}$ | A | A | ○ | ⊚ | ⊚ |
| Comparative product | 29 | Cu-20 | 100 | 16 | 2 | A | 1 | e | 3 | $4.1 \times 10^{-3}$ | C | C | △ | X | X |
| | 30 | Cu-10 | 100 | 16 | 22 | B | 20 | e | 3 | $3.5 \times 10^{-3}$ | C | C | △ | X | X |
| | 31 | Cu-10 | 100 | 17 | 40 | B | 40 | b | 3 | $8.5 \times 10^{-3}$ | C | C | ○ | △ | △ |
| | 32 | Cu-10 | 100 | 17 | 30 | — | — | d | 5 | $6.7 \times 10^{-3}$ | C | C | ○ | △ | △ |
| | 33 | Cu-10 | 100 | 18 | 7 | C | 13 | f | 1 | $5.3 \times 10^{-3}$ | C | C | ○ | X | X |
| | 34 | Cu-10 | 100 | 18 | 100 | — | — | a | 5 | ∞ | — | — | ○ | △ | △ |
| | 35 | Cu-10 | 100 | 19 | 10 | A | 20 | e | 5 | $6.2 \times 10^{-3}$ | C | C | — | — | — |
| | 36 | Cu-10 | 100 | — | — | A | 100 | c | 5 | $3 \times 10^{-3}$ | — | — | ○ | △ | △ |
| | 37 | Cu-10 | 100 | — | — | D | 100 | e | 5 | ∞ | — | — | ○ | △ | △ |
| | 38 | Ni | 100 | 17 | 30 | C | — | a | 5 | $1 \times 10^{-3}$ | B | B | ○ | △ | △ |

TABLE 4-continued

| | | | | | | | | | | | | | | |
|---|---|---|---|---|---|---|---|---|---|---|---|---|---|---|
| | 39 | Ag | 100 | 17 | 30 | C | — | a | 5 | $9.2 \times 10^{-5}$ B | B | ○ | Δ | Δ |

Note:
[1] polyhydroxystyrene derivative
[2] The amount of blending is expressed in terms of active ingredient.

| | | Conductive paste composition (parts)[2] | | | | | | | | | | | | |
|---|---|---|---|---|---|---|---|---|---|---|---|---|---|---|
| | | conductive powder | | binder | | | | additive | | | Mois- | | | Adhesion |
| | | | | PVA derivative[1] | | thermosetting resin | | | | | ture | Heat | | |
| | | | amt. of | | amt. of | | amt. of | | amt. of | Volume | resis- | resis- | Print- | cop- | insu- |
| No. | | symbol | blend- ing | No. | blend- ing | symbol | blend- ing | symbol | blend- ing | resistivity ($\Omega \cdot$ cm) | tance | tance | ability | per foil | lating layer |
| Product of the present invention | 41 | Cu-10 | 100 | B1 | 7 | A | 15 | b | 3 | $1.1 \times 10^{-4}$ | AA | A | ○ | ⊙ | ⊙ |
| | 42 | Cu-20 | 100 | B2 | 7 | B | 18 | d | 5 | $8.2 \times 10^{-5}$ | A | A | ○ | ⊙ | ⊙ |
| | 43 | Cu-10 | 100 | B3 | 25 | B | 33 | e | 3 | $8.3 \times 10^{-5}$ | AA | A | ○ | ⊙ | ⊙ |
| | 44 | Cu-6 | 100 | B4 | 52 | B | 28 | a | 5 | $4.1 \times 10^{-4}$ | A | A | ○ | ⊙ | ⊙ |
| | 45 | Cu-20 | 100 | B5 | 20 | A | 20 | f | 3 | $5.2 \times 10^{-4}$ | A | A | ○ | ⊙ | ⊙ |
| | 46 | Cu-10 | 100 | B6 | 15 | C | 15 | f | 0.5 | $7 \times 10^{-5}$ | A | A | ○ | ⊙ | ⊙ |
| | 47 | Cu-10 | 100 | B7 | 10 | C | 12 | c | 5 | $1.4 \times 10^{-4}$ | A | A | ○ | ⊙ | ⊙ |
| | 48 | Cu-10 | 100 | B8 | 15 | A | 32 | e | 3 | $7 \times 10^{-5}$ | A | A | ○ | ⊙ | ⊙ |
| | 49 | Cu-10 | 100 | B9 | 8 | D | 25 | e | 0.3 | $6 \times 10^{-5}$ | AA | A | ○ | ⊙ | ⊙ |
| | 50 | Cu-10 | 100 | B9 | 35 | B | 35 | e | 3 | $1.0 \times 10^{-4}$ | AA | A | ○ | ⊙ | ⊙ |
| | 51 | Cu-10 | 100 | B9 | 10 | A | 20 | e | 3 | $7 \times 10^{-5}$ | AA | A | ○ | ⊙ | ⊙ |
| | 52 | Cu-10 | 100 | B10 | 5 | C | 15 | c | 5 | $1.8 \times 10^{-4}$ | AA | A | ○ | ⊙ | ⊙ |
| | 53 | Cu-10 | 100 | B11 | 0.3 | A | 7 | b | 3 | $1.5 \times 10^{-4}$ | A | A | ○ | ⊙ | ⊙ |
| | 54 | Cu-10 | 100 | B12 | 6 | A | 14 | c | 5 | $7 \times 10^{-5}$ | AA | A | ○ | ⊙ | ⊙ |
| | 55 | Cu-10 | 100 | B12 | 9 | B | 21 | e | 4 | $8.3 \times 10^{-5}$ | AA | A | ○ | ⊙ | ⊙ |
| | 56 | Cu-10 | 100 | B13 | 6 | A | 14 | b | 3 | $8.5 \times 10^{-5}$ | AA | A | ○ | ⊙ | ⊙ |
| | 57 | Cu-10 | 100 | B13 | 9 | B | 21 | f | 5 | $9.2 \times 10^{-5}$ | AA | A | ○ | ⊙ | ⊙ |
| | 58 | Ni | 100 | B2 | 10 | A | 10 | f | 3 | $1.2 \times 10^{-3}$ | AA | A | ○ | ⊙ | ⊙ |
| | 59 | Ni | 100 | B3 | 15 | B | 20 | c | 5 | $9.2 \times 10^{-4}$ | AA | A | ○ | ⊙ | ⊙ |
| | 60 | Ni | 100 | B9 | 20 | C | 10 | e | 3 | $9.6 \times 10^{-4}$ | AA | A | ○ | ⊙ | ⊙ |
| | 61 | Ni | 100 | B9 | 5 | D | 20 | e | 3 | $1.6 \times 10^{-3}$ | AA | A | ○ | ⊙ | ⊙ |
| | 62 | Ag | 100 | B3 | 10 | A | 10 | d | 5 | $3.7 \times 10^{-5}$ | AA | A | ○ | ⊙ | ⊙ |
| | 63 | Ag | 100 | B5 | 15 | B | 15 | b | 3 | $4.2 \times 10^{-5}$ | A | A | ○ | ⊙ | ⊙ |
| Com- parative product | 64 | Cu-20 | 100 | 14 | 40 | A | 40 | e | 3 | $2 \times 10^{-2}$ | C | C | Δ | X | X |
| | 65 | Cu-10 | 100 | 15 | 10 | A | 10 | e | 3 | $3.5 \times 10^{-3}$ | C | C | Δ | X | X |
| | 66 | Cu-20 | 100 | 16 | 8 | B | 17 | d | 5 | $4.6 \times 10^{-3}$ | C | B | ○ | Δ | X |
| | 67 | Cu-10 | 100 | 16 | 100 | — | | d | 5 | ∞ | — | — | ○ | Δ | X |
| | 68 | Cu-10 | 100 | 17 | 15 | D | 15 | b | 3 | $8.0 \times 10^{-2}$ | C | B | ○ | X | X |
| | 69 | Cu-10 | 100 | — | — | A | 100 | a | 5 | $2 \times 10^{-3}$ | C | C | ○ | Δ | X |
| | 70 | Cu-10 | 100 | — | — | D | 100 | d | 5 | ∞ | C | C | Δ | Δ | Δ |
| | 71 | Ni | 100 | 16 | 10 | A | 10 | a | 5 | $1 \times 10^{-3}$ | B | B | ○ | Δ | Δ |
| | 72 | Ag | 100 | 16 | 15 | A | 15 | a | 5 | $4.1 \times 10^{-4}$ | B | B | ○ | Δ | Δ |

Note:
[1] hydroxystyrene copolymer and/or its derivative
[2] The amount of blending is expressed in terms of active ingredient.

Various characteristics of the conductive pastes of the present invention in comparison with the comparative products are given in Table 4.

It can be understood that the conductive copper paste Nos. 1 to 22 according to the present invention exhibit an excellent volume resistivity, i.e., a volume resistivity of the order of $10^{-4}$ to $10^{-5}$ $\Omega$·cm and superior to the comparative product Nos. 29 to 37 in the moisture resistance, heat resistance and adhesion.

Further, it is apparent that product Nos. 23 to 26, i.e., conductive nickel pastes according to the present invention, and product Nos. 27 and 28, i.e., conductive silver pastes according to the present invention as well, are superior to the comparative product Nos. 38 and 39 in the moisture resistance, heat resistance and adhesion.

As is apparent from the foregoing description, the use of the conductive paste of the present invention enables a conductive layer excellent particularly in the durability and adhesion to be provided.

Various characteristics of the conductive pastes of the present invention in comparison with the comparative products are given in Table 4.

It can be understood that the conductive copper paste Nos. 41 to 57 according to the present invention exhibit an excellent volume resistivity, i.e., a volume resistivity of the order of $10^{-4}$ to $10^{-5}$ $\Omega$·cm and superior to the comparative product Nos. 24 to 30 in the moisture resistance, heat resistance and adhesion.

Further, it is apparent that product Nos. 58 to 61, i.e., conductive nickel pastes according to the present invention, and product Nos. 62 and 63, i.e., conductive silver pastes according to the present invention as well, are superior to the comparative product Nos. 71 and 72 in the moisture resistance, heat resistance and adhesion.

As is apparent from the foregoing description, the use of the conductive paste of the present invention enables a conductive layer excellent particularly in the durability and adhesion to be provided.

We claim:

1. An electrically conductive paste composition which comprises an electrically conductive powder having a mean particle diameter of 1 to 30 $\mu$, 5 to 85 parts by weight, based on 100 parts by weight of the conductive powder of an organic binder comprising a polymer of a hydroxystyrene having the formula (A) or a copolymer of hydroxystyrene having the formula (B), said polymer and copolymer each having a weight-average molecular weight of 1,000 to 2,000,000, and a solvent

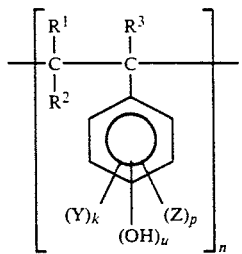
(A)

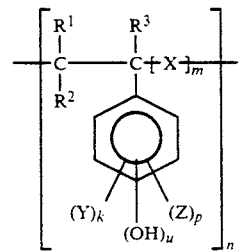
(B)

wherein m>0 and n≧3;

0≦k≦2;

0≦p≦2;

1≦u≦2, provided that k+p+m>0; and k+p+u>1;

$R^1$ to $R^3$ are each hydrogen or an alkyl group having 1 to 5 carbon atoms;

X us a polymerizable vinyl monomer;

Y and Z may be the same or different and are each selected from among;

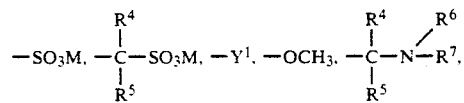

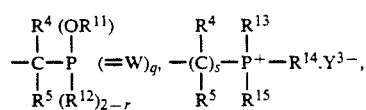

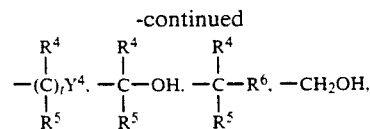

alkyl groups having 1 to 18 carbon atoms and aryl groups, wherein M is hydrogen, an alkali metal, an alkaline earth metal or an organic cation of an amine etc.;

$Y^1$ and $Y^4$ are each a halogen;

$Y^{2-}$ to $Y^{3-}$ are each a counter ion such as a halogen, an organic acid anion or an inorganic acid anion;

W is a sulfur or oxygen;

$R^4$ to $R^8$ may be the same or different and are each a straight-chain or branched alkyl group having 1 to 36 carbon atoms or an alkyl group derivative, such as a hydroxyalkyl group, an aromatic group or hydrogen, provided that $R^4$ to $R^7$ may be combined with nitrogen to form a ring;

$R^9$ to $R^{15}$ may be the same or different and are each a straight-chain or branched alkyl group having 1 to 36 carbon atoms or an alkyl group derivative, such as hydroxyalkyl group, an aromatic group or hydrogen;

q, s and t are each 0 or 1; and r is 0, 1 or 2, provided that the formula (A) has no $Y^1$.

2. The composition as claimed in claim 1, which comprises 100 parts by weight of the electrically conductive powder and 0.1 to 60 parts by weight of the polymer or copolymer for the binder.

3. The composition as claimed in claim 1, which further comprises a thermoplastic resin, said organic binder and thermoplastic resin being present in an amount of 5 to 85 parts by weight.

4. The composition as claimed in claim 1, which comprises 100 parts by weight of the powder, 0.1 to 60 parts by weight of the polymer or copolymer for the binder and a thermoplastic resin, the sum total of the polymer and copolymer and the thermoplastic resin ranging from 5 to 85 parts by weight.

5. The composition as claimed in claim 1, in which Y and Z are each

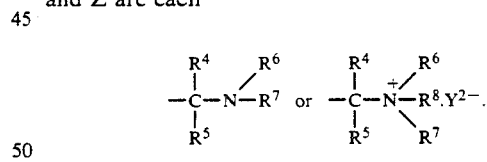

6. The composition as claimed in claim 1, in which said polymer and copolymer have a weight-average molecular weight of 4,000 to 80,000.